United States Patent
Mielke et al.

(10) Patent No.: US 6,910,194 B2
(45) Date of Patent: Jun. 21, 2005

(54) SYSTEMS AND METHODS FOR TIMING A LINEAR DATA PATH ELEMENT DURING SIGNAL-TIMING VERIFICATION OF AN INTEGRATED CIRCUIT DESIGN

(75) Inventors: David James Mielke, Fort Collins, CO (US); Victoria Meier, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 41 days.

(21) Appl. No.: 10/199,137

(22) Filed: Jul. 19, 2002

(65) Prior Publication Data

US 2004/0015801 A1 Jan. 22, 2004

(51) Int. Cl.[7] ............................................. G06F 17/50
(52) U.S. Cl. .............................................. 716/6; 716/4
(58) Field of Search ....................... 716/6, 1–5, 7–21; 345/440

(56) References Cited

U.S. PATENT DOCUMENTS

| | | | | |
|---|---|---|---|---|
| 6,185,723 B1 * | 2/2001 | Burks et al. | .................. | 716/6 |
| 6,305,001 B1 * | 10/2001 | Graef | ......................... | 716/12 |
| 6,311,314 B1 * | 10/2001 | McBride | ....................... | 716/6 |
| 6,457,159 B1 * | 9/2002 | Yalcin et al. | ................. | 716/6 |
| 6,536,024 B1 * | 3/2003 | Hathaway | ..................... | 716/6 |
| 6,567,967 B2 * | 5/2003 | Greidinger et al. | ........... | 716/10 |
| 6,591,407 B1 * | 7/2003 | Kaufman et al. | ............. | 716/10 |
| 6,611,949 B2 * | 8/2003 | Becker et al. | ................. | 716/6 |
| 2002/0087940 A1 * | 7/2002 | Greidinger et al. | ........... | 716/2 |
| 2002/0116695 A1 * | 8/2002 | Bou-Ghazale et al. | ......... | 716/6 |
| 2003/0051222 A1 * | 3/2003 | Williams et al. | .............. | 716/12 |
| 2003/0052880 A1 * | 3/2003 | Fredrickson | ................ | 345/440 |
| 2003/0088838 A1 * | 5/2003 | Becker et al. | ................. | 716/6 |
| 2003/0115564 A1 * | 6/2003 | Chang et al. | .................. | 716/8 |
| 2003/0177455 A1 * | 9/2003 | Kaufman et al. | .............. | 716/2 |
| 2004/0003361 A1 * | 1/2004 | Chaudhari | ..................... | 716/6 |

FOREIGN PATENT DOCUMENTS

EP          0903660 A1 *   3/1999    ............. G06F/1/10

* cited by examiner

*Primary Examiner*—Leigh M. Garbowski
*Assistant Examiner*—Magid Y. Dimyan

(57) ABSTRACT

Systems and methods for timing a linear data path element within an integrated circuit design are provided. A representative system includes a computer and a memory element associated with the computer. The computer includes logic for receiving information describing the integrated circuit design. The integrated circuit design includes a description of a signal-timing path and the clock distribution system across the integrated circuit. The memory is configured with executable steps to generate a model of a signal that traverses a signal-timing path that is coupled to a linear element. The model includes a mechanism for simulating clock signal operation over a plurality of clock distribution structure types. A representative method includes the following steps: acquiring circuit information; identifying a signal path within the circuit information; recognizing when the signal-timing path is coupled to a linear element; associating a clock uncertainty with the clock signal; determining a confidence interval for the signal-timing path responsive to the recognizing step, wherein the clock signal is propagated along the signal-timing path; and associating the confidence interval with the signal-timing path.

24 Claims, 13 Drawing Sheets

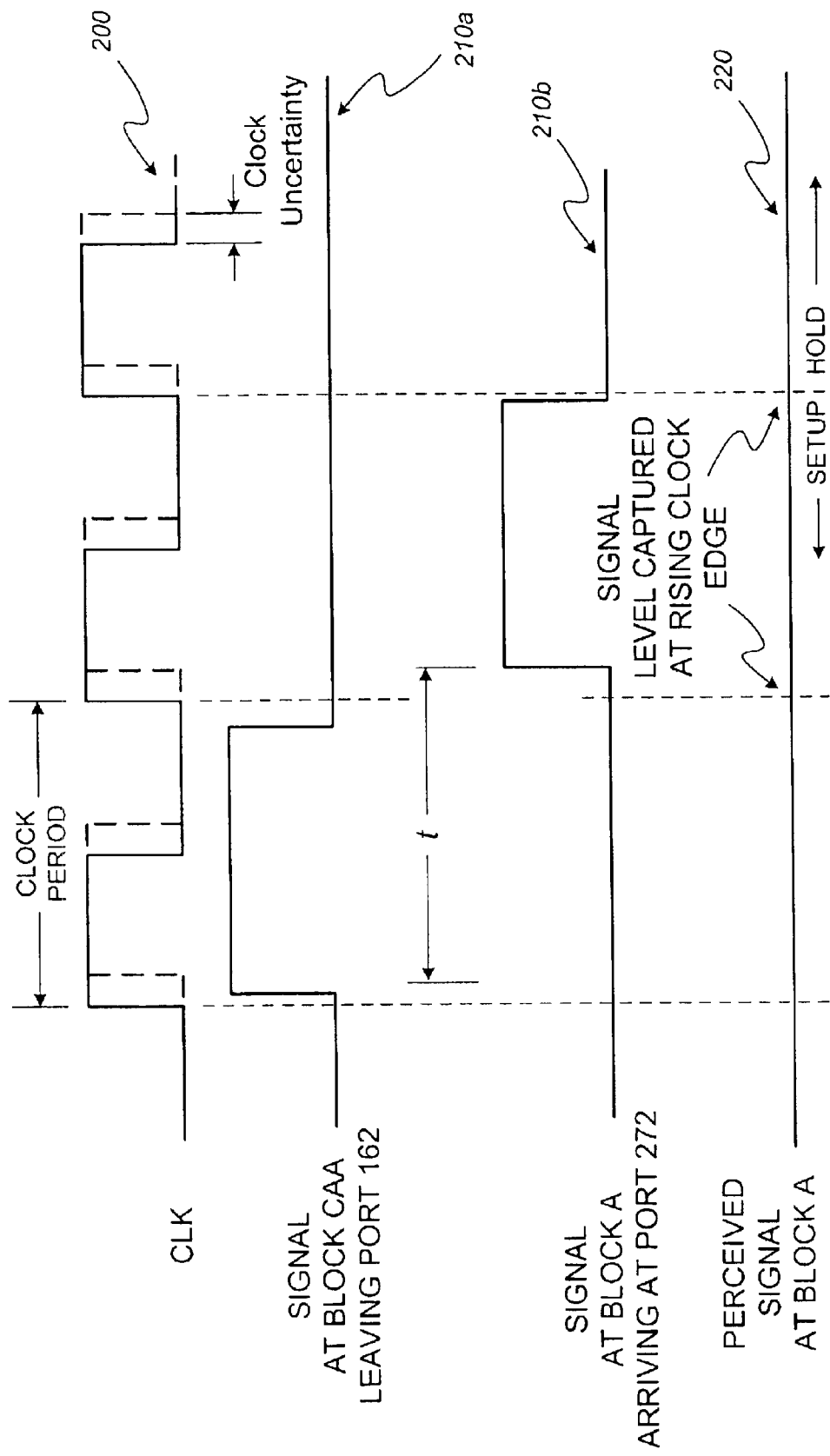

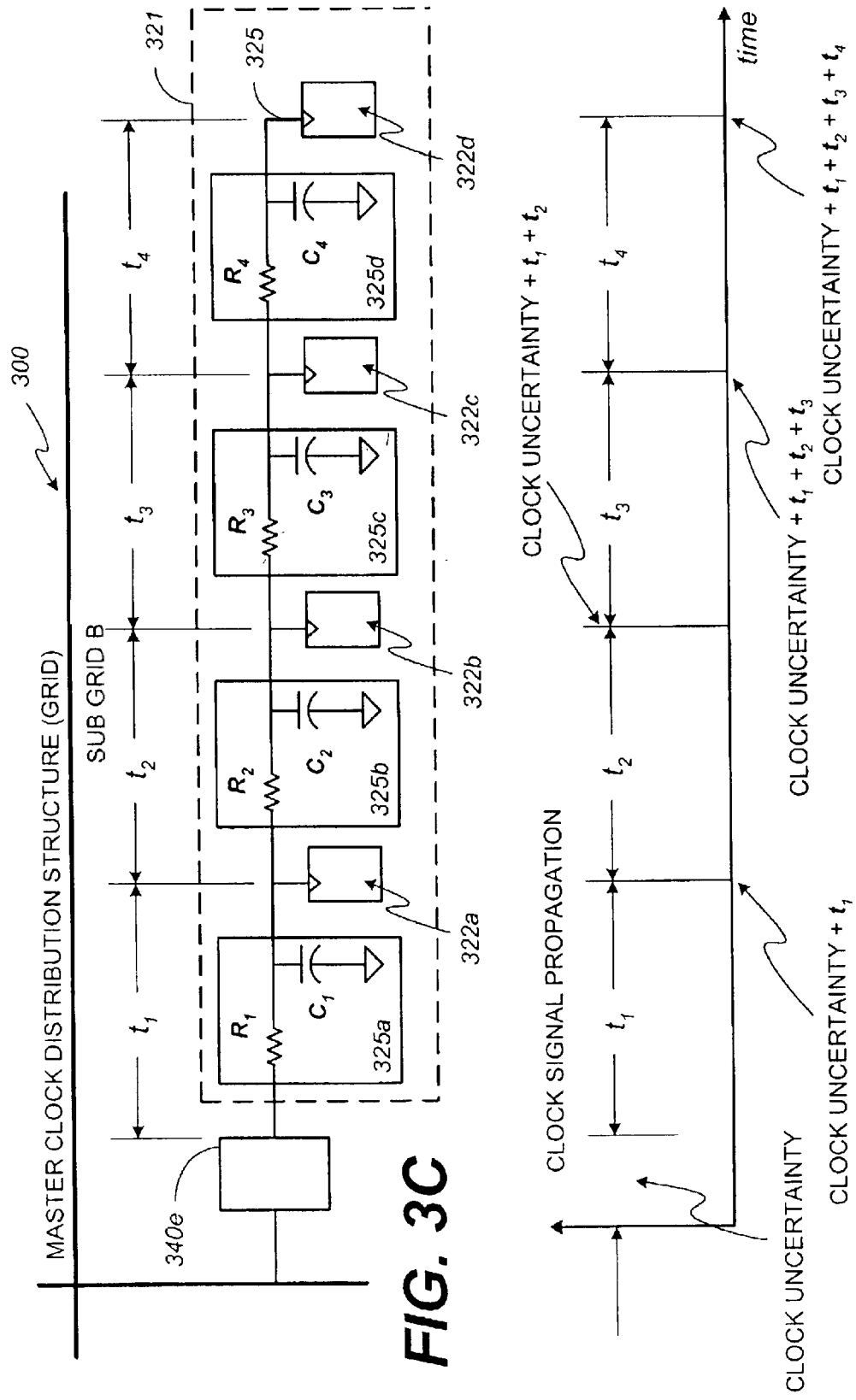

SYSTEMS AND METHODS FOR TIMING A LINEAR DATA PATH ELEMENT DURING SIGNAL-TIMING VERIFICATION OF AN INTEGRATED CIRCUIT DESIGN

BACKGROUND OF THE INVENTION

1. Technical Field

The present invention generally relates to computer aided integrated circuit design systems, and more particularly to systems and methods for accurately verifying signal timing for signal paths in an integrated circuit.

2. Description of the Related Art

Integrated circuits are electrical circuits that arrange transistors, resistors, capacitors, and other components on a single semiconductor die or substrate, upon which the various components are interconnected to perform a variety of functions. Typical examples of integrated circuits include, for example, microprocessors, programmable-logic devices (PLDs), electrically-erasable-programmable-read-only memory devices (EEPROMs), random-access-memory (RAM) devices, operational amplifiers, voltage regulators, etc.

Often, circuit designs are simulated by computer to verify functionality and timing to ensure that performance goals will be satisfied. Design and circuit analysis procedures are often performed using electronic-computer aided design (E-CAD) tools. The design and subsequent simulation of a very large scale integration (VLSI) circuit or other electrical devices via E-CAD tools allows a product design to be confirmed and often eliminates the need for building a prototype. Thus, E-CAD tools may enable a VLSI circuit manufacturer to bypass costly and time consuming prototype construction and performance verification stages in the product development process.

A VLSI circuit design can be represented at different levels of abstraction using a hardware description language. Some hardware description languages support circuit descriptions at a register-transfer level, as well as at a logic level.

At any level of abstraction, a circuit design may be specified using behavioral or structural descriptions, or a combination of both. A behavioral description is often specified using Boolean functions. A structural description may include a list describing the various connections in a network of primitive or higher-level cells. Such a list is often called a "netlist." The netlist may be used by logic synthesizers, circuit simulators, and other circuit design optimization tools to model the circuit. Examples of primitive cells are, among others, full-adders, logic gates, latches, and flip-flops. A register is an example of a higher-level (i.e., a non-primitive) cell.

A number of known systems use information provided in netlists to evaluate circuit timing and other related parameters. Although the operational specifics vary from system to system, generally such systems operate by identifying certain critical timing paths, modeling the conductors and the various cells defining each critical timing path using a resistor-capacitor (RC) network, and then evaluating the circuit to determine whether timing violations occur for signals required to traverse each of the critical paths. A static timing tool, which is a specific type of optimization tool can be used to confirm that received input signals will arrive in time for the receiving block to process the signals, and that block output signals will reach their designated destination circuits before the next clock cycle. Static timing tools are designed with a focus on cell to cell (e.g., register to register) travel time estimates.

One of the more difficult aspects of VLSI circuit design deals with the problem of how to identify and resolve circuit failures due to signal timing problems. Signal timing problems are often not identified until after each functional block designer has completed and integrated a specific functional block circuit design into a timing model. Once timing problems are identified, they are often resolved through an iterative process of redesign and retest using a static timing tool.

One factor that affects signal timing success across the various functional blocks of a VLSI circuit design is clock uncertainty. Clock uncertainty refers to an expected range of time within which the distributed clock signal will transition at any single component within the circuit. To minimize clock uncertainty (i.e., to maintain relatively tight coordination of data signal transfers), VLSI circuit designers use clock distribution schemes that attempt to simultaneously provide a clock signal to each circuit component involved in a data transfer.

A typical approach is to construct a generally symmetrical clock distribution structure with similarly constructed clock buffers to deliver the clock signal across the VLSI circuit. This approach lends itself to a relatively simple timing model once limits for the clock uncertainty are identified. However, this approach requires a complete clock distribution structure for each functional block. As a result, this approach can lead to inefficient use of available circuit area. Not only will this approach adversely impact integrated circuit efficiency, the simple timing model suitable for signal paths supplied by the distributed clock signal represents an oversimplification when linear data path structures are introduced in the integrated circuit.

A linear data path structure is a collection of logic circuits or elements connected in series. Generally, data path structures serially process each bit of a group of bits. Because the overall signal processing delay for a clock signal that traverses each of the logic circuits or elements of the linear data path structure is cumulative and because the transition time degrades for a signal received at each successive circuit or element, the clock uncertainty model does not accurately reflect signal timing relationships for signal paths that originate and or terminate within a linear data path.

In addition to the above mentioned shortcomings of applying a clock uncertainty model when analyzing signal timing relationships, these signal timing relationships become more important with increases in clock signal frequency. As the clock signal frequency increases, the corresponding shorter clock cycles increase the relative importance of signal transfer delays between elements in a linear data path structure. Moreover, static timing tools do not provide a mechanism to convey signal timing performance information for signals that traverse linear data path structures.

In light of competitive pressures to design functional VLSI circuits with confidence that functional blocks will operate as desired over time while reducing the design life cycle and development costs, it can be understood that there is a need for systems and methods that address these and/or other shortcomings of the prior art.

SUMMARY

Systems and methods of the present invention relate to verifying signal-timing relationships for signals that traverse linear data path structures of an integrated circuit. More specifically, systems and methods of the present invention verify that signals that are serially processed from element to element will behave as expected. The systems and methods of the present invention can be used to develop a confidence interval. A confidence interval is a period of time or buffer in addition to the minimum time during which a signal event is likely to occur. Thus, longer confidence intervals go hand in hand with greater probability that the integrated circuit will function as designed. The systems and methods of the invention account for clock signal propagation delays and transition time degradation for signals that traverse linear data structures within the integrated circuit.

A representative circuit design system includes a computer and a memory element associated with the computer. The computer is configured with logic describing an integrated circuit that includes a description of a signal-timing path and a clock distribution system. The memory is configured to generate a confidence interval for a signal that traverses the signal-timing path. Where, the signal-timing path includes a linear element and wherein the confidence interval accounts for clock signal operation over a plurality of clock-distribution structures.

A representative method includes the following steps: acquiring circuit information, the circuit information comprising a plurality of cells and a clock-signal distribution system; identifying a signal-timing path; recognizing when the signal-timing path is coupled to a linear element; associating a clock uncertainty with the clock signal; determining a confidence interval for the signal-timing path responsive to the recognizing step; and associating the confidence interval with the signal-timing path.

Other systems, methods, and features of the present invention will be or become apparent to one skilled in the art upon examination of the following drawings and detailed description. It is intended that all such additional systems, methods, and features are included within this description, are within the scope of the present invention, and are protected by the accompanying claims.

BRIEF DESCRIPTION OF THE DRAWINGS

The invention can be better understood with reference to the following drawings. The components in the drawings are not necessarily to scale relative to each other. Emphasis instead is placed upon clearly illustrating the principles of the present invention. Moreover, in the drawings, like reference numerals designate corresponding parts throughout the several views.

FIGS. 2A and 2B are schematic representations of a clock and a data signal from the integrated circuit of FIG. 1.

FIGS. 3A–3D are a set of schematic representations illustrating a clock distribution structure and linear element clock propagation that can be applied within embodiments of the invention.

DETAILED DESCRIPTION OF THE PREFERRED EMBODIMENT

Figure 1:
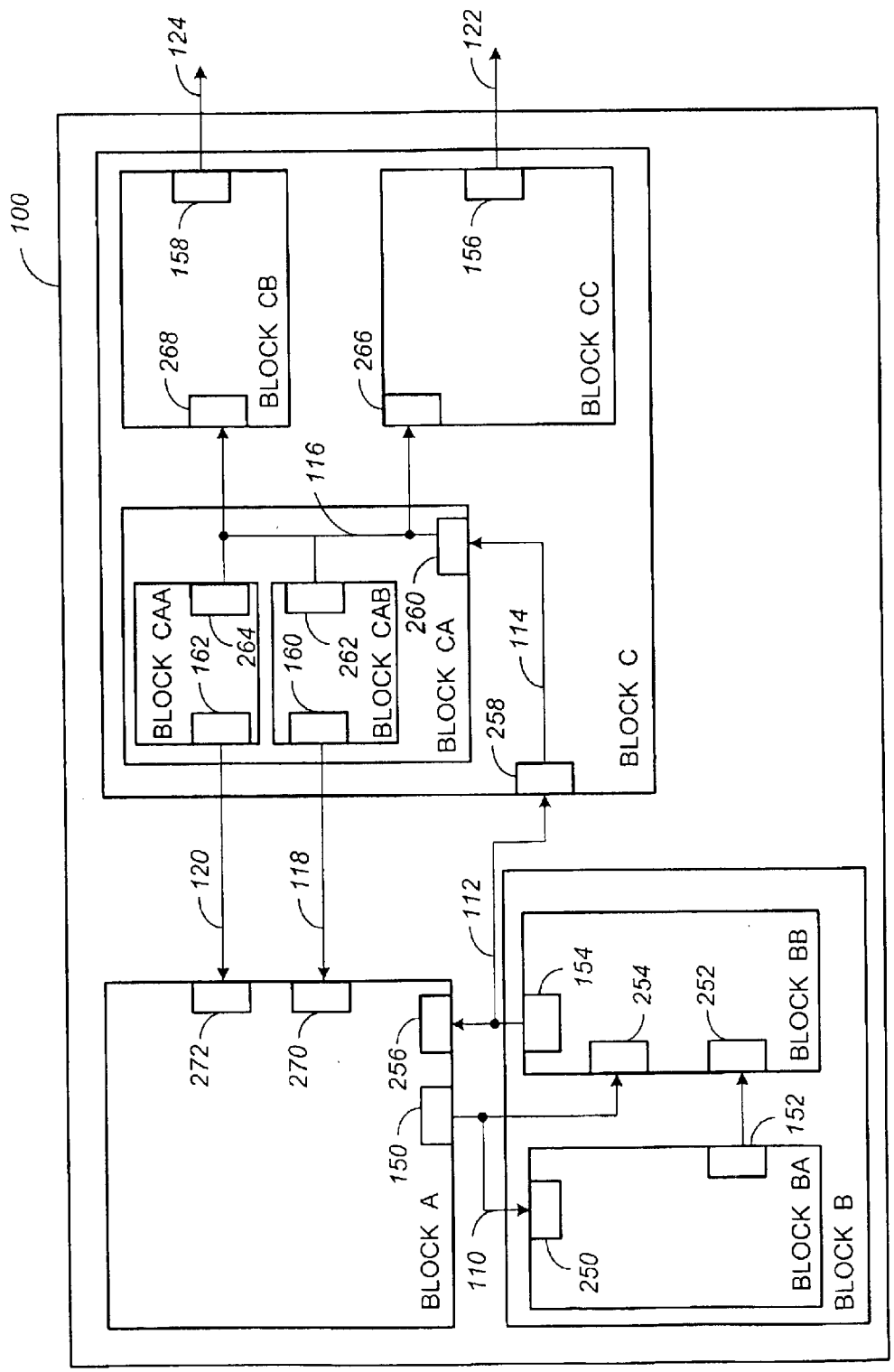
FIG. 1 is a block diagram of an integrated circuit that can be modeled and analyzed by embodiments of the invention.

The block diagrams and schematic presented in FIGS. 1 and 2 are provided to illustrate and describe aspects of computer aided circuit design pertinent to the present invention. In this regard, FIG. 1 shows that an integrated circuit may be arranged and modeled with a plurality of separately defined functional blocks arranged and coupled in a hierarchical fashion across the integrated circuit. FIG. 2 illustrates the importance of tightly coordinating the relative timing between clock and data signals across an integrated circuit.

FIG. 1 is a block diagram illustrating an embodiment of an integrated circuit representation 100 that may be generated by a computer aided design tool. The integrated circuit representation 100 illustrated in FIG. 1 is grossly oversimplified for ease of illustration and discussion of aspects pertinent to the scope of the invention. It should be understood that VLSI circuits may contain tens to hundreds of millions of transistors and other various functional components. It should be further understood that an integrated circuit at that level of integration may be designed by individual circuit designers and/or teams of circuit designers tasked with developing component arrangements to meet various functional and timing specifications. Thus, functional divisions or blocks may be assigned to various circuit designers or teams to design separate portions of the integrated circuit.

In this regard, the integrated circuit representation 100 includes circuit blocks labeled, A, B, and C. Circuit blocks A, B, and C may each contain circuitry configured to perform one or more designated functions for one or more time-varying input signals. The circuit blocks A, B, and C may also be configured with appropriate conductors to forward output signals to each other, and in some cases to destinations other than those on the integrated circuit 100. Circuit blocks A, B, and C are representative of a first level of the overall integrated circuit representation 100.

As shown in FIG. 1, circuit blocks B and C contain other circuit blocks. For example, circuit block B contains circuit blocks BA and BB. Circuit blocks BA and BB may be alternatively described as child blocks (of the parent level block B) or second-level blocks. In this regard, the child or second-level blocks BA and BB are hierarchically arranged above the first level of the integrated circuit 100. Circuit bock C contains child or second-level blocks CA, CB, and CC. In addition, block CA further includes child or third-level blocks CAA and CAB.

Circuit blocks may both receive and/or send time varying signals to or from other circuit blocks via various conductors. These input and output signals may traverse functional blocks at the same hierarchical level (e.g., the first, second, and third levels, respectively), as well as at different hierarchical levels (e.g., between the third and the first levels). For example, conductor 110 connects circuit block A with circuit block B at the first hierarchical level. Circuit block B is also coupled to circuit blocks BA and BB at the second hierarchical level. Conversely, conductor 120 connects circuit block CAA with circuit block A thus coupling the third hierarchical level to the first hierarchical level.

For simplicity of illustration and description, the integrated circuit representation 100 omits respective ports at the intersection of conductors and the border of each functional block at each hierarchical level. For example, ports are omitted at the intersection of block CA and block C. It should be understood, that each functional block can be modeled by the conductors (inputs and outputs) that traverse the border of the functional block at one or more hierarchical levels. In other words, conductor 118 may be modeled by adding both an input and an output port within block CA and an input and an output port within block C in addition to port 160 and port 270.

Furthermore, the integrated circuit representation 100 illustrates only three levels of hierarchy. It should be further understood that more or fewer levels of hierarchy are contemplated and may be modeled and analyzed in the contemplated system. Moreover, the contemplated system may be programmed to model and analyze each possible level to level interconnection, in a multi-level hierarchically arranged integrated circuit.

At one level of abstraction, circuit block A can be modeled or described by output port 150 and inputs ports 256, 270, and 272, and the various internal circuits (not shown) that may be coupled to the ports. As illustrated in FIG. 1, each of the separate ports 150, 256, 270, and 272 may be modeled at the interface of circuit block A. Similarly, circuit block B can be modeled by input port 250 and output port 154 and the various internal circuits (not shown) that may be coupled to the ports. In addition, circuit B can be modeled at a second level of abstraction that may account for output port 152, input ports 252 and 254, as well as the various internal circuits of blocks BA and BB, respectively. It should be understood that circuit block C, among other circuit blocks not illustrated, can be similarly represented at various levels of abstraction.

After each of the various circuit blocks A, B, and C have been appropriately modeled at a particular level of abstraction (i.e., level of interest), the integrated circuit representation 100 can be modeled by identifying and modeling each of the conductors that carry signals both to and from each of the circuit blocks. For example, circuit blocks A and B are connected between ports 150, 250, and 254 by conductor 110 and between ports 154 and 256 by conductor 112. Circuit blocks B and C are connected between ports 154 and 258 by conductor 112. Circuit blocks C and A are connected between ports 160 and 270 by conductor 118 and between ports 162 and 272 by conductor 120.

Circuit block C is configured to receive signals applied to conductor 112 at port 258. Conductor 114 couples port 258 to port 260 located within block CA. Conductor 116 couples port 260 to ports 262, 264, 266, and 268 located within circuit blocks CAB, CAA, CC, and CB, respectively. Circuit block CC provides a first output signal to one or more devices off the integrated circuit 100 via port 156 and conductor 122. Similarly, circuit block CB provides a second output signal via port 158 and conductor 124.

Figure 2A:
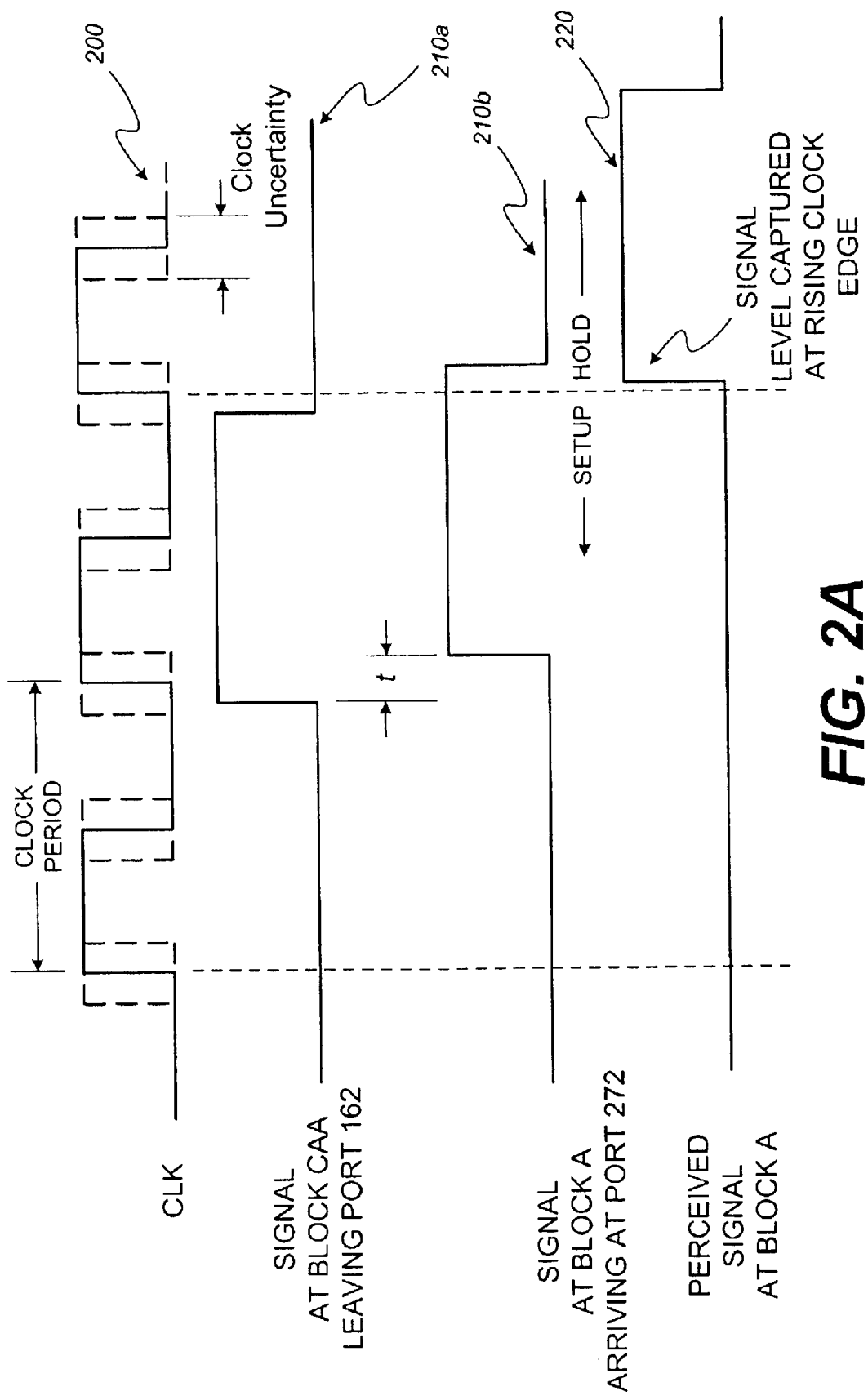

Reference is now directed to the timing diagrams illustrated in FIGS. 2A and 2B. In this regard, each of the four signals illustrated in FIG. 2A represents a time-varying voltage signal that may be expected to be observed at the indicated locations within the integrated circuit representation 100 of FIG. 1 (if the representation were manufactured). The upper-most time-varying signal 200 is representative of a clock signal that may be distributed to and throughout each of the functional blocks of the integrated circuit. For the purposes of this discussion, it is assumed that the clock distribution scheme applies the clock signal uniformly throughout the entire integrated circuit. Stated another way, it is assumed that for a circuit configured to respond to the leading edge of the clock signal that the leading edge arrives at each component across the integrated circuit at the same time. Despite the assumption, the clock signal 200 may be modeled over time by the sum of the representative signal trace and a clock uncertainty. Note that clock uncertainty can be both positive and negative and represents that amount of time that may elapse (or not elapse) relative to a particular clock cycle event. In other words, if the clock uncertainty value is 150 picoseconds (psec.) the leading edge of the clock signal may arrive at a particular point in the integrated circuit within 150 psec. of a desired time.

Proceeding down the illustration, the next time-varying signal is a representative signal 210a observed exiting port 162 from circuit block CAA along conductor 120 (see FIG. 1). Thereafter, FIG. 2A presents the representative signal 210a as it might be observed at port 272 of circuit block A (see FIG. 1). Note that while the time-varying plots indicate that the general shape of the time-varying signal 210a that exits circuit block CAA will be the same when it arrives at circuit block A, the received signal is shifted by time, t, such that the signal arrives at a different relative position within the clock period. Note that for integrated circuits configured to trigger on a leading (i.e., rising) edge of a clock signal transition, the time-varying signal 210b at port 272 of circuit block A may be interpreted or perceived as shown by time-varying signal 220 perceived at port 272 of circuit block A. When t is relatively short in duration in comparison to the clock period as shown in FIG. 2A, data signals that traverse the integrated circuit are generally interpreted correctly.

Conversely, when t is relatively long in duration in comparison to the clock period as shown in FIG. 2B, data signals that traverse data paths of the integrated circuit may be interpreted incorrectly at the destination register. When t approaches the clock period, the received time-varying signal 210b replicates the shape of the time-varying signal 210a transmitted from block CAA. However, because the setup and hold times are no longer met, the signal 210b when sampled at the leading edges of the clock signal 200 produces the non-varying signal 220 at block A.

Time, t, includes multiple components. Referring back to FIG. 1, a signal that traverses conductor 120 may be described by the following intervals: a first travel interval between a source element (e.g., a driving register) within block CAA and the border of block CAA, which can include a delay associated with traversing circuit elements within block CAA; a second travel interval from the border of block CAA to the border of block CA; a third travel interval from the border of block CA to the border of block C; a fourth travel interval from the border of block C to the border of block A; and a fifth travel interval from the border of block A to a destination element within block A. Those skilled in the art will understand that both the total time, t, that a signal takes to traverse the conductor 120, as well as the clock signal uncertainty and transition time will affect the time at which a signal will be perceived at a destination element within the integrated circuit.

For leading edge triggered logic circuits, a clock signal transition time is the amount of time that it takes the clock signal to charge a capacitive load coupled to the clock signal to a voltage level that is perceived or registered as a rising clock signal transition by circuit elements coupled to the clock signal. Conversely, for falling edge triggered logic circuits, a clock signal transition time is the amount of time that it takes the clock signal to discharge a capacitive load coupled to the clock signal to a voltage level that is registered as a falling clock signal transition by circuit elements coupled to the clock signal.

A hierarchically and functionally arranged integrated circuit, as well as the importance of the relative timing between clock and data signals across the integrated circuit having been illustrated and described with regard to FIGS. 1, 2A, and 2B, reference is now directed to FIGS. 3A–3D.

Figure 3A:
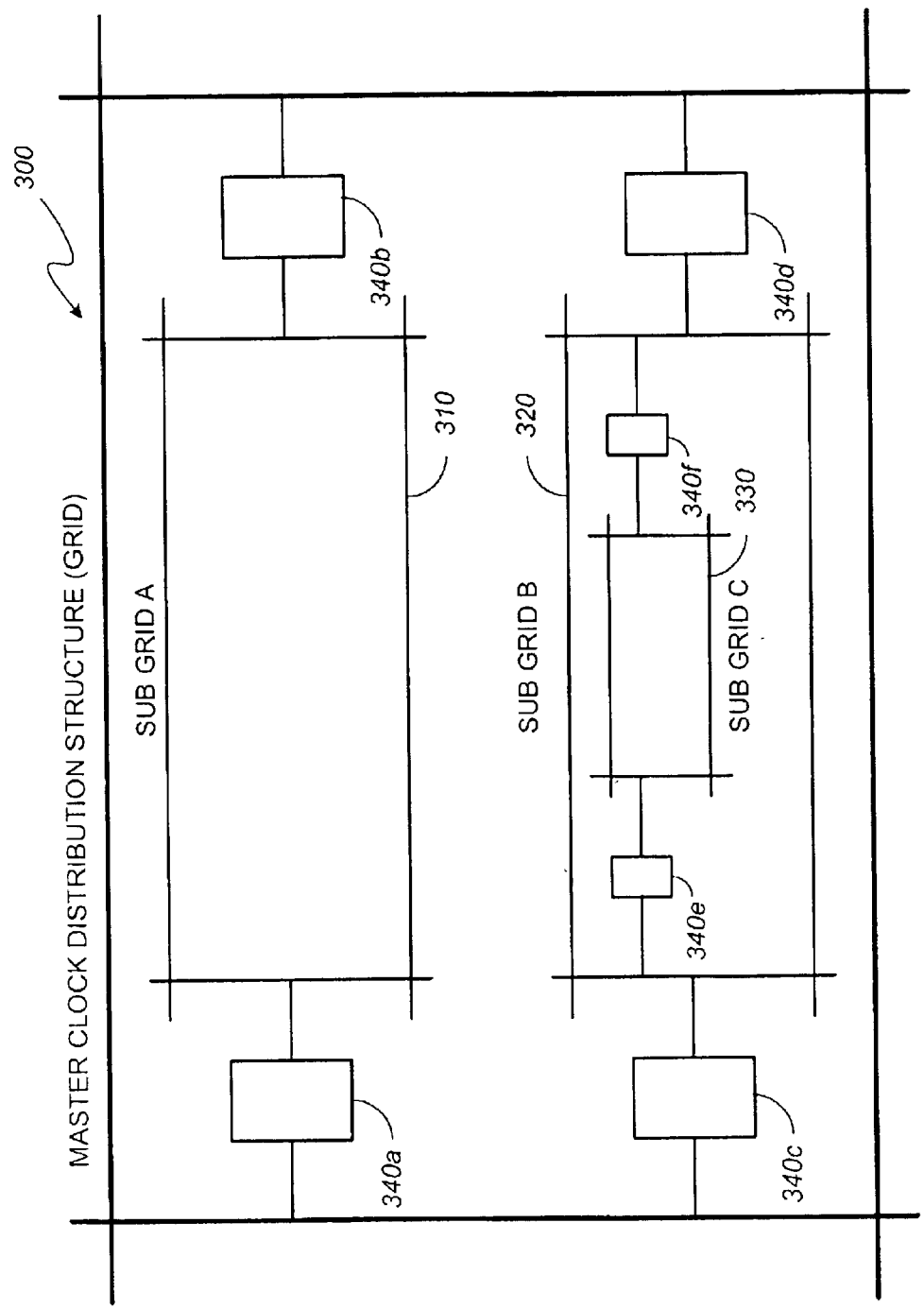

In this regard, FIG. 3A presents a master-clock distribution structure 300 in the form of a grid. The master-clock distribution structure 300 illustrated in FIG. 3A is only a portion of a clock distribution system, which supplies each portion of the integrated circuit with a clock signal. As shown in FIG. 3A, the master-clock distribution structure 300, includes subgrid A 310 and subgrid B 320. Subgrid A 310 is coupled to the master-clock distribution structure 300 via clock buffers 340a and 340b. Subgrid B 320 is coupled to the master-clock distribution structure 300 via clock buffers 340c and 340d. Subgrid B 320 contains subgrid C, which is coupled to the master-clock distribution structure 300 via clock buffers 340e and 340f via subgrid B 320. Note that each of the subgrids A, B, and C contains a plurality of circuit elements (not shown for simplicity of illustration) that may be arranged and coupled to perform a designated function.

Figure 3B:
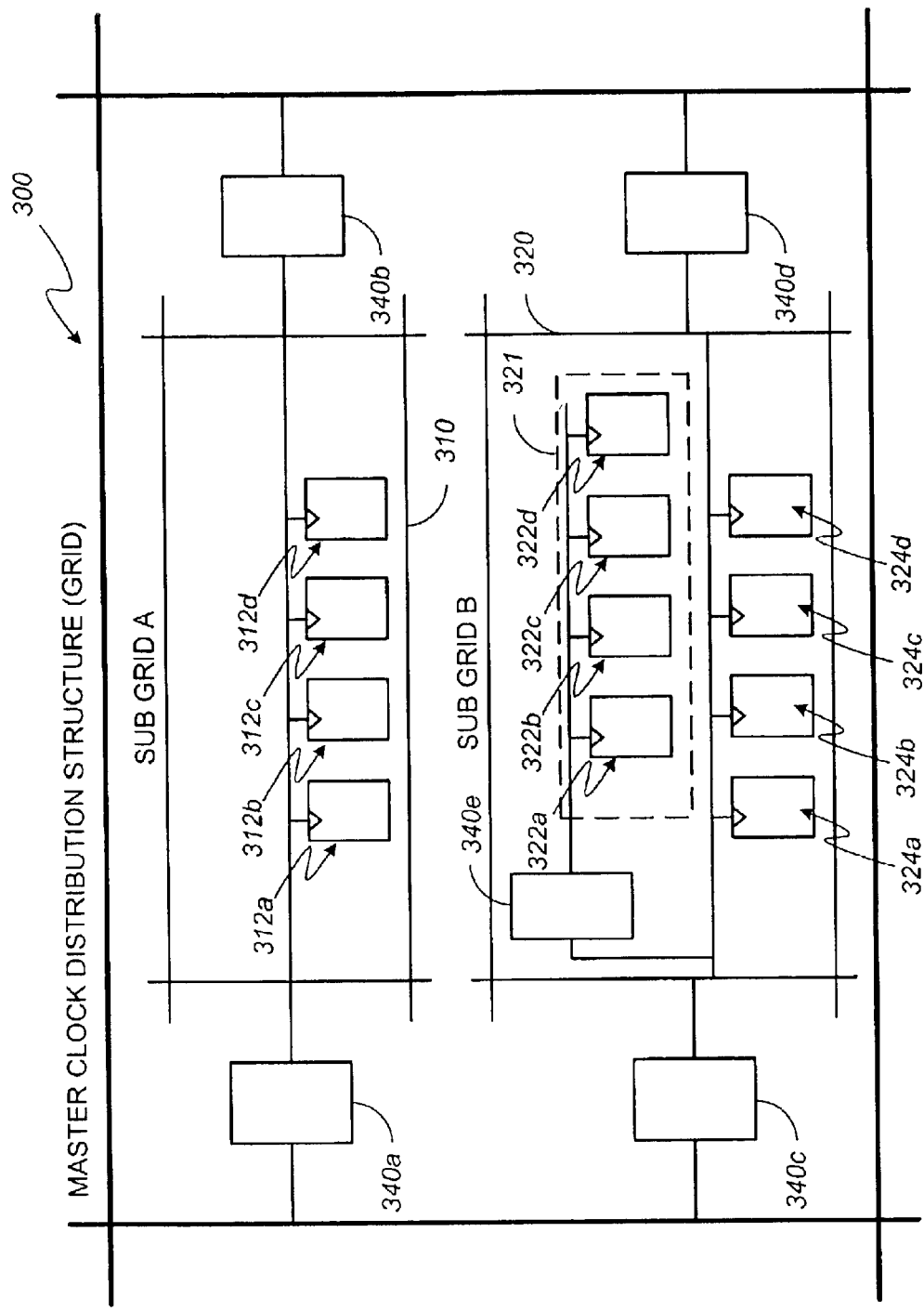

FIG. 3B illustrates representative circuit elements integrated with the master-clock distribution structure 300 of FIG. 3A. In this regard, subgrid A 310 contains storage elements 312a, 312b, 312c, 312d integrated with the subgrid A 310. The storage elements 312a, 312b, 312c, 312d are coupled to the grid between the clock buffers 340a and 340b. Because storage elements 312a and 312d at each end of the serial combination of the representative circuit are coupled to respective clock buffers 340a and 340b each of the individual storage elements 312a, 312b, 312c, and 312d will receive clock signal transitions within a clock uncertainty time (i.e., a time interval) that may be established for subgrids A and B and other portions of the integrated circuit.

Subgrid B 320 contains serially coupled storage elements 324a, 324b, 324c, 324d integrated with subgrid B 320. The serially coupled storage elements 324a, 324b, 324c, and 324d will also receive clock signal transitions within a clock uncertainty interval. As illustrated in FIG. 3B, subgrid B 320 may be configured to include a linear element 321 coupled to the subgrid B 320 via clock buffer 340e. Unlike storage elements 312a, 312b, 312c, and 312d that are coupled at both ends to the clock distribution structure 300 (i.e., the grid) as described above, the linear element 321 is coupled to the clock distribution structure 300 via a single clock supply conductor (i.e., the conductor coupling clock buffer 340e with the linear element 321). As shown, the linear element 321 includes a plurality of serially coupled storage elements 322a, 322b, 322c, and 322d. As described above, a clock signal that traverses each of the storage elements 322 within the linear element will be delayed in time. In addition, the clock signal will be affected by the cumulative capacitive loading of each additional storage element 322 within linear element 321.

FIG. 3C is a schematic diagram that illustrates the cumulative travel times, represented by times, $t_1$ through $t_4$ for a clock signal that traverses linear element 321 of FIG. 3B. Each of the separate legs of the internal conductor 325 coupling storage elements 322a through 322d may be represented or modeled by a resistor and a capacitor. Stated another way, the time it takes the clock signal to travel from clock buffer 340e to the input of storage element 322a, $t_1$, is a function of $R_1$ and $C_1$. The time it takes the clock signal to reach the input of storage element 322b, $t_1+t_2$, is a function of $R_1$, $R_2$, $C_1$, and $C_2$. The time it takes the clock signal to reach the inputs of storage elements 322c and 322d can be computed after properly accumulating the separate times. The time plot of FIG. 3D illustrates the relationship between clock uncertainty and the separate travel times, $t_1$ through $t_4$, as the clock signal propagates through linear element 321. The specific resistance and capacitance values associated with each resistor-capacitor pair in the model will impact the clock signal as it traverses or propagates along conductor 325 past each subsequent storage element 322. Specific resistance and capacitance values can be provided in accordance with design characteristics (e.g., the length, width, and material used in each leg of the conductor 325), as well as typical capacitive loads for the particular storage element circuit arrangement selected to form the linear element 321.

Figure 4A:
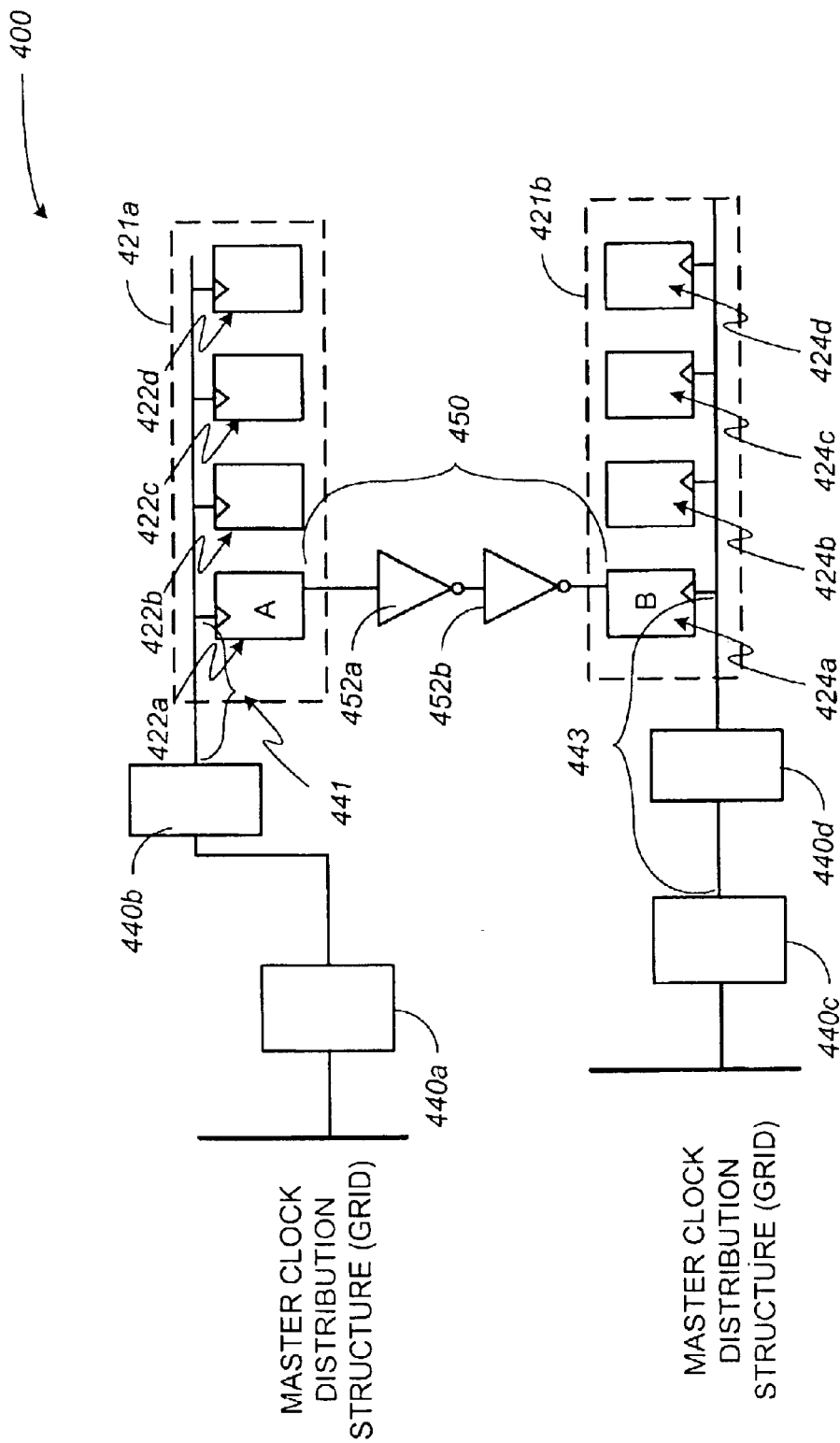
FIGS. 4A–4C are a set of is a schematic representations illustrating a signal-timing path between two linear elements and various measures that may be associated with the signal-timing path for setup and hold cases, respectively.

Reference is now directed to the circuit schematic diagram illustrated in FIG. 4A. Integrated circuit 400 contains a first linear element 421a and a second linear element 421b. The first linear element 421a is coupled to the master clock distribution structure via clock buffers 440a and 440b. The second linear element 421b is coupled to the master clock distribution structure via clock buffers 440c and 440d. As shown in FIG. 4A, the first linear element 421a is also coupled to the second linear element 421b via signal-timing path 450.

More specifically, signal-timing path 450 couples the first storage element 422a of the first linear element 421 with the first storage element 424a of the second linear element 421b. The representative signal-timing path 450 illustrated in FIG. 4A contains a first inverter 452a and a second inverter 452b coupled in series. It should be understood that signal-timing path 450 is presented for simplicity of illustration and discussion. Generally, signals propagated along a signal-timing path of an integrated circuit will traverse a plurality of circuit elements including logic gates, buffers, etc. on the way from a source element to a destination element.

Figure 4B:
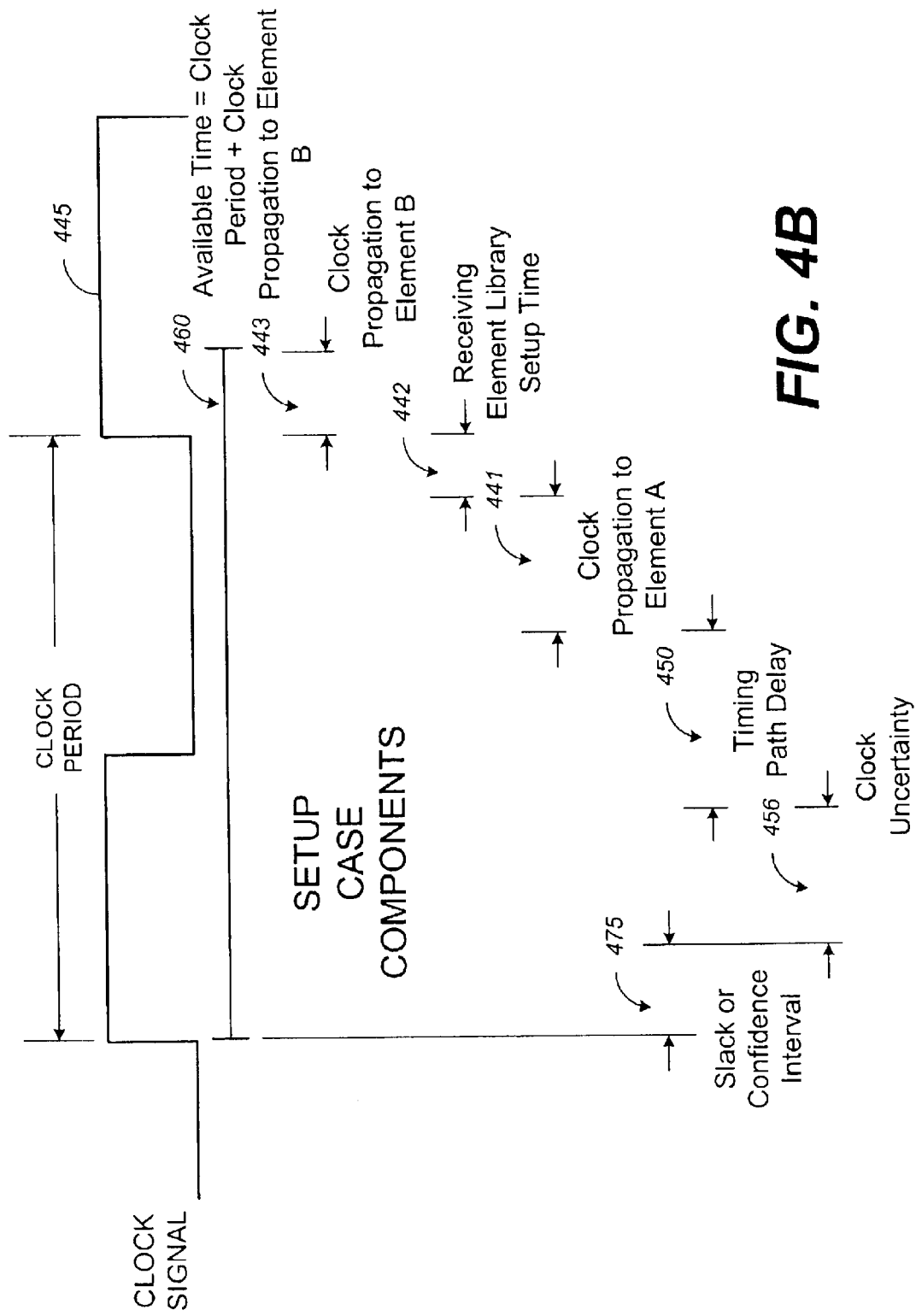

For this portion of the integrated circuit 400 to function as desired, the data signal that traverses the signal-timing path 450 should arrive at element 424a before the sum of the clock period and the clock propagation to element 424a. Not only should the data signal that traverses elements 422a, 452a, and 452b arrive at element 424a within this available time or setup time, the data signal should remain at the appropriate voltage range at the receiving element for a hold duration. This hold duration for the integrated circuit 400 may be defined as the sum of the propagation time along the signal-timing path 450 (i.e., the conductor and buffers between the storage element labeled, "A" and the storage element labeled, "B") and the clock signal propagation time to the first storage element 422a of the first linear element 421a, signal-timing path In this regard, the clock signal trace and the various time intervals in the schematic of FIG. 4B illustrate the manner in which the various time intervals affect a slack or confidence interval that may be determined for a data signal that originates within a first linear element and terminates at a second linear element for a setup case. As illustrated in FIG. 4B, a clock signal may be characterized by a clock period or the amount of time that elapses between periodic events along the clock signal trace 445 (e.g., a rising or a falling clock signal). For the clock signal trace 445 shown in FIG.

4B, the clock period is shown from a leading edge of a first pulse to a leading edge of a second pulse of the clock signal. The available time interval 460 is the sum of the clock period and the clock propagation time to storage element 424a introduced in FIG. 4A. The time interval 460 is the amount of time available for a signal originating at storage element 422a (FIG. 4A) to reach storage element 424a (FIG. 4A) with confidence that the signal will be accurately interpreted by the destination element (i.e., storage element 424a).

As illustrated in the schematic of FIG. 4B, a receiving element library setup time 442, the clock signal propagation time 441 to storage element 422a, the timing path delay 450 (i.e., the time it takes a signal to traverse the signal-timing path 450), and the clock uncertainty 456 together reduce time interval 460. The receiving element library setup time 442 is that amount of time applied in the integrated circuit model for the receiving element to recognize a logic level change at its input. A slack or confidence interval 475 can be defined by that portion of the time interval 460 that remains after each of the above-mentioned clock propagation and signal travel times have been subtracted from the time interval 460. The timing diagram illustrated in FIG. 4B is applicable for determining a slack, or confidence, level 475 for a setup case for a signal that originates and terminates at linear elements.

Figure 4C:
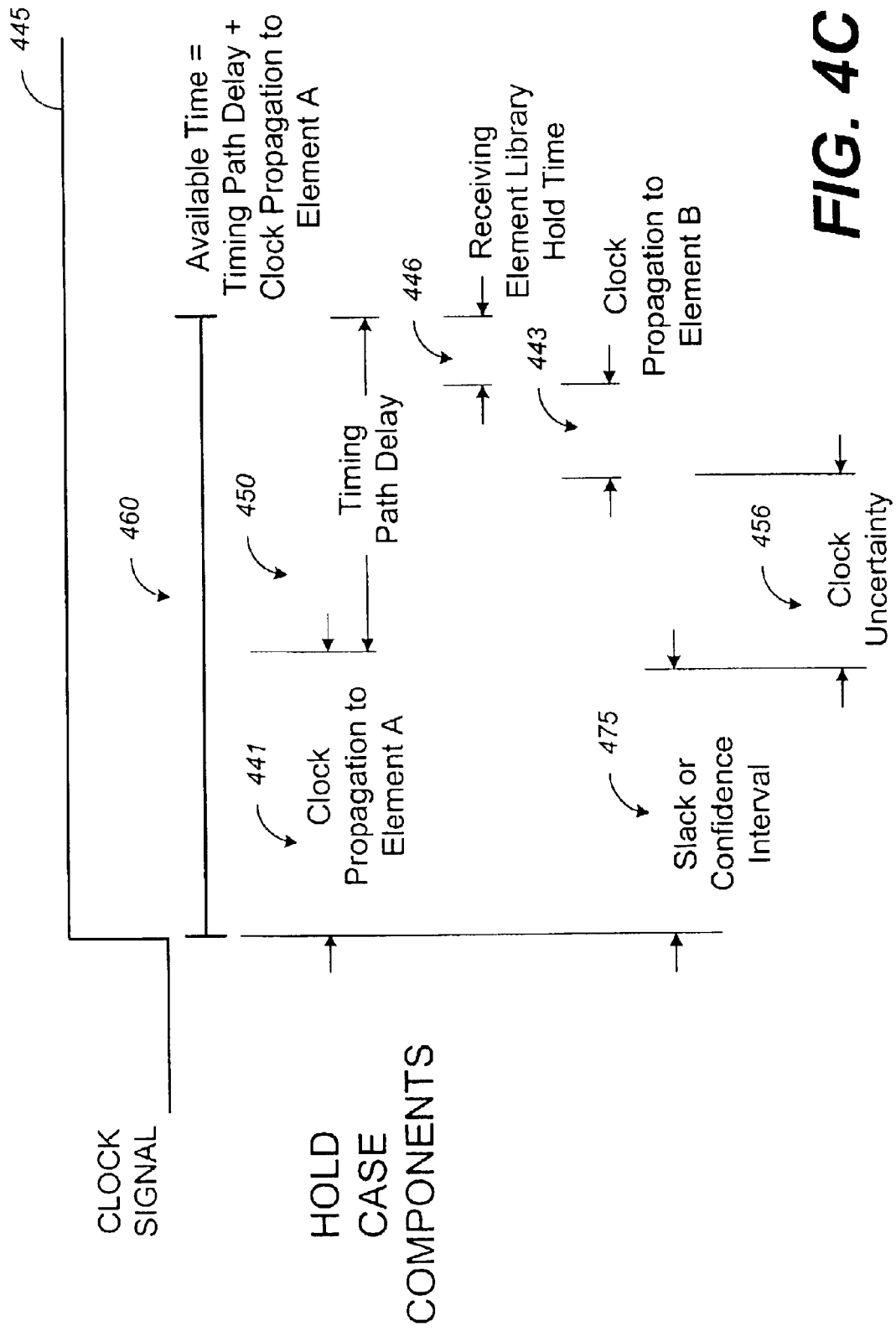

The clock signal trace and the various time intervals in the schematic of FIG. 4C illustrate the manner in which the various time intervals affect a slack or confidence interval that may be determined for a data signal that originates within a first linear element and terminates at a second linear element for a hold case. As illustrated by the clock signal trace 445 of FIG. 4C, the hold case delay and propagation times generally fall well within a clock signal period. For the hold case, the available time interval 460 is the sum of the timing path delay 450 and the clock propagation time to source element 422a introduced in FIG. 4A. The time interval 460 is the amount of time available for a signal arriving at storage element 424a (FIG. 4A) to be sampled with confidence that the data signal will be accurately interpreted by the destination element (i.e., storage element 424a).

As illustrated in the schematic of FIG. 4C, a receiving element library hold time 446, the clock signal propagation time 443 to storage element 424b, and the clock uncertainty 456 together reduce time interval 460. The receiving element library hold time 446 is that amount of time applied in the integrated circuit model for the receiving element to respond to a logic level change at its input. A slack or confidence interval 475 can be defined by that portion of the time interval 460 that remains after each of the above-mentioned clock propagation and signal travel times have been subtracted from the time interval 460. The timing diagram illustrated in FIG. 4C is applicable for determining a slack, or confidence, level 475 for a hold case for a signal that originates and terminates at linear elements. The setup and hold case confidence interval calculations may be modified to reflect signal-timing paths where only the source or the destination element are contained within a linear element.

Moreover, the confidence level 475 can be determined and reported for each signal-timing path in the integrated circuit design that is coupled to a linear element. In turn, the confidence interval 475 can be forwarded to static timing tools or other signal timing analysis tools to ensure adequate coordination between clock and data signals within the integrated circuit 400.

Figure 5:
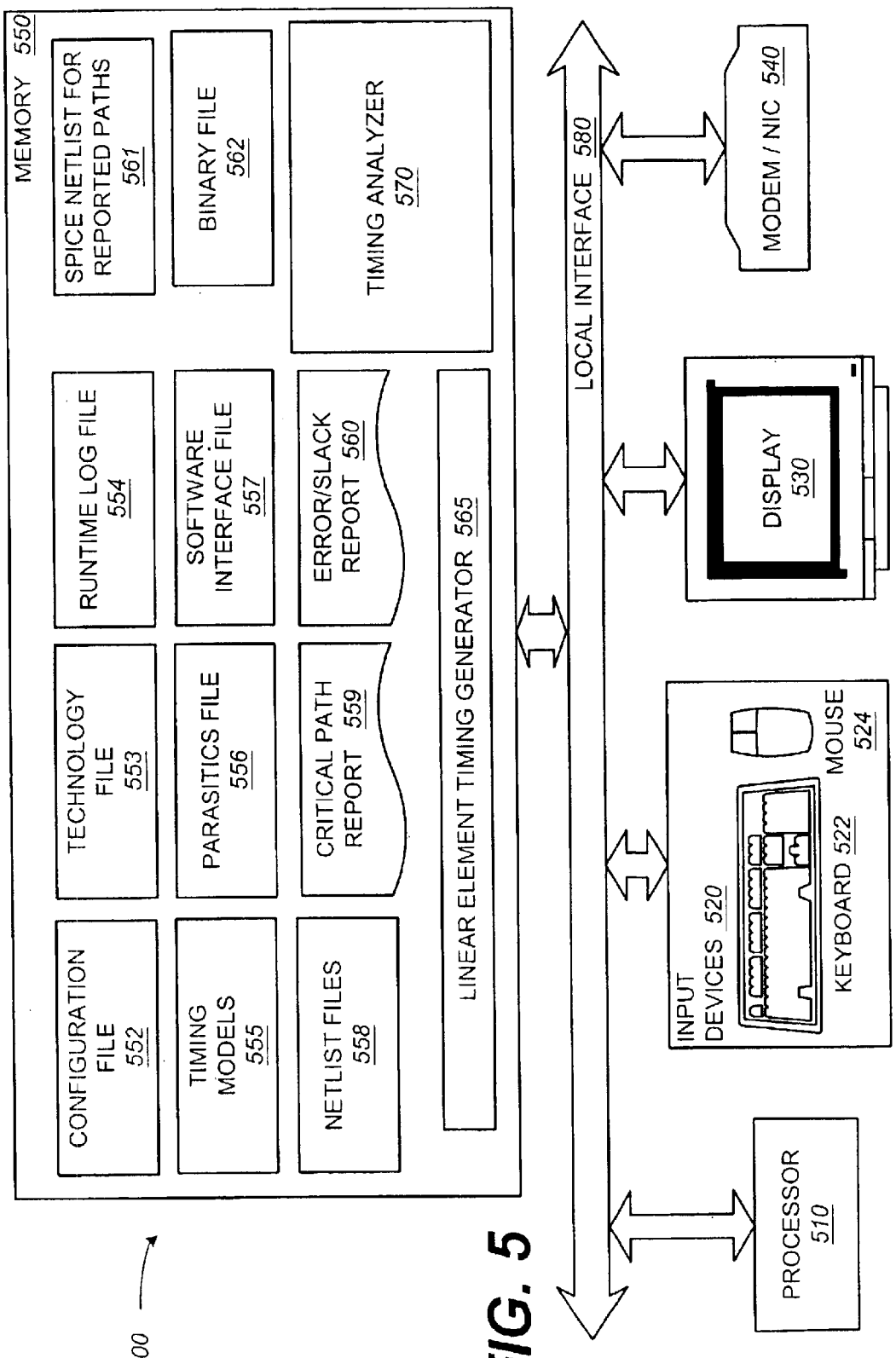
FIG. 5 is a block diagram illustrating an embodiment of a computing system that may be used to design and analyze the integrated circuit representations of FIGS. 1 and 3A–3D.

FIG. 5 presents a block diagram illustrating an embodiment of a computing system that may be used to analyze the clock and signal timing relationships described above with regard to the integrated circuit representations and signal traces of FIGS. 1, 2, 3A–3D, and 4A–4C. In this regard, the general-purpose computer 500 may include a processor 510, input devices 520, a display device 530, a network interface device 540, and a memory 550 that communicate with each other via a local interface 580. The local interface 580 can be, but is not limited to, one or more buses or other wired or wireless connections as is known in the art. The local interface 580 may have additional elements, such as buffers (caches), drivers, and controllers (omitted here for simplicity), to enable communications. Further, the local interface 580 includes address, control, and data connections to enable appropriate communications among the aforementioned components.

The processor 510 is a hardware device for executing software stored in memory 550. The processor 510 can be any custom made or commercially available processor, a central processing unit (CPU) or an auxiliary processor associated with the computer 500, and a semiconductor based microprocessor (in the form of a microchip) or a macroprocessor. Examples of suitable commercially available microprocessors are as follows: a PA-RISC series microprocessor from Hewlett-Packard Company, an 80×86 or Pentium series microprocessor from Intel Corporation, a PowerPC microprocessor from IBM, a Sparc microprocessor from Sun Microsystems, Inc, or a 68xxx series microprocessor from Motorola Corporation.

The input devices 520 may include, but are not limited to, a keyboard 522, a mouse 524 among other interactive pointing devices, voice activated interfaces, or other suitable operator-machine interfaces (not shown for simplicity of illustration). The input devices 520 can also take the form of an image acquisition device (e.g., a scanner) or a data file transfer device (i.e., a floppy disk drive (not shown). Each of the various input devices 520 may be in communication with the processor 510 and/or the memory 550 via the local interface 580. Data received from an image acquisition device connected as an input device 520 or via the network interface device 540 may take the form of an image, a flat file, a database, or other various information transfer methodologies in addition to the aforementioned operator commands.

The display device 530 may include a video interface that supplies a video output signal to a display monitor associated with the computer 500. The display device(s) that can be associated with the computer 500 can be conventional CRT based displays, liquid crystal displays (LCDs), plasma displays, or other display types. It should be understood, that various output devices (not shown) may also be integrated via local interface 580 and/or via network interface device 540 to other well-known devices such as plotters, printers, etc.

Local interface 580 may also be in communication with input/output devices that connect the computer 500 to a network (not shown). These two-way communication devices include, but are not limited to, modulators/demodulators (modems), network interface cards (NIC), radio frequency (RF) or other transceivers, telephonic interfaces, bridges, and routers. For simplicity of illustration, such two-way communication devices are represented by modem/NIC 540.

The memory 550 can include any one or combination of volatile memory elements (e.g., random-access memory (RAM, such as dynamic RAM or DRAM, static RAM or SRAM, etc.)) and nonvolatile-memory elements (e.g., read-only memory (ROM), hard drive, tape drive, compact disc (CD-ROM), etc.). Moreover, the memory 550 may incorporate electronic, magnetic, optical, and/or other types of storage media. Note that the memory 550 can have a distributed architecture, where various components are situated remote from one another, but can be accessed by the processor 510.

The software in memory 550 may include one or more separate programs, files, reports, or logs. For example, the memory 550 may include a simulation program with integrated circuit emphasis (SPICE) netlist for reported circuit paths 561 (e.g., conductors), a binary file 562, a linear element timing generator 565, and a timing analyzer 570. Each of the one or more separate programs will comprise an ordered listing of executable instructions for implementing logical functions. Furthermore, the software in the memory 550 may include a suitable operating system (not shown). A non-exhaustive list of examples of suitable commercially available operating systems is as follows: a Windows operating system from Microsoft Corporation, a Netware operating system available from Novell, Inc., a UNIX operating system, which is available for purchase from many vendors, such as Hewlett-Packard Company and Sun Microsystems, Inc., or a LINUX operating system, which is available from Red Hat, Inc. The operating system essentially controls the execution of other computer programs, such as the linear element timing generator 565, and provides scheduling, input-output control, file and data management, memory management, and communication control and related services.

It should be understood that the linear element timing generator 565 can be implemented in software, firmware, hardware, or a combination thereof. The linear element timing generator 565 in the present example, is a source program, executable program (object code), script, or any other entity comprising a set of instructions to be performed. When in the form of a source program, the linear element timing generator 565 is translated via a compiler, assembler, interpreter, or the like, which may or may not be included within the memory 550, to operate in connection with the operating system. Furthermore, the linear element timing generator 565 can be written as (a) an object-oriented programming language, which has classes of data and methods, or (b) a procedure-programming language, which has routines, subroutines, and/or functions, for example but not limited to, C, C++, Pascal, Basic, Fortran, Cobol, PERL, Java, and Ada.

In the representative general-purpose computer 500 illustrated in FIG. 5, the memory 550 includes configuration file 552, timing models 555, one or more netlist files 558, technology file 553, and a parasitics file 556, each containing various input information. The critical path report 559, runtime log file 554, software interface file 557, and error/slack report 560 may also be found and/or generated and stored in memory 550. Memory 550 may also include a timing analyzer 570 configured to interface with one or more of the above files and models to verify designer compliance with one or more design ground rules for the integrated circuit.

It will be understood by those skilled in the art that the actual implementation of the various configuration files 552, timing models 555 netlist files 558, technology files 553, parasitics file 556, as well as the critical path report 559, runtime log file 554, software interface file 557, and error/slack report 560 will vary based on the underlying technology being modeled and the requirements of various computer aided design tools integrated with the general-purpose computer 500 to perform one or more circuit design steps.

It will be further understood that the software and/or firmware in memory 550 may also include a basic input output system (BIOS) (not shown). The BIOS is a set of essential software routines that test hardware at startup, launch the operating system, and support the transfer of data among hardware devices. The BIOS is stored in read-only memory and is executed when the general-purpose computer 500 is activated.

When the general-purpose computer 500 is in operation, the processor 510 executes software stored in memory 550, communicates data to and from memory 550, and generally controls operations of the coupled input/output devices pursuant to the software. The linear element timing generator 565, the operating system, and any other applications are read in whole or in part by the processor 510, buffered by the processor 510, and executed.

When the linear element timing generator 565 is implemented in software, as shown in FIG. 5, it should be noted that the linear element timing generator 565 can be stored on any computer-readable medium for use by or in connection with any computer-related system or method. In the context of this document, a computer-readable medium is an electronic, magnetic, optical, or other physical device or means that can contain or store a computer program for use by, or in connection with a computer-related system or method. The computer-readable medium can be, for example but not limited to, an electronic, magnetic, optical, electromagnetic, infrared, or semiconductor system, apparatus, device, or propagation medium.

Operation

Figure 6:
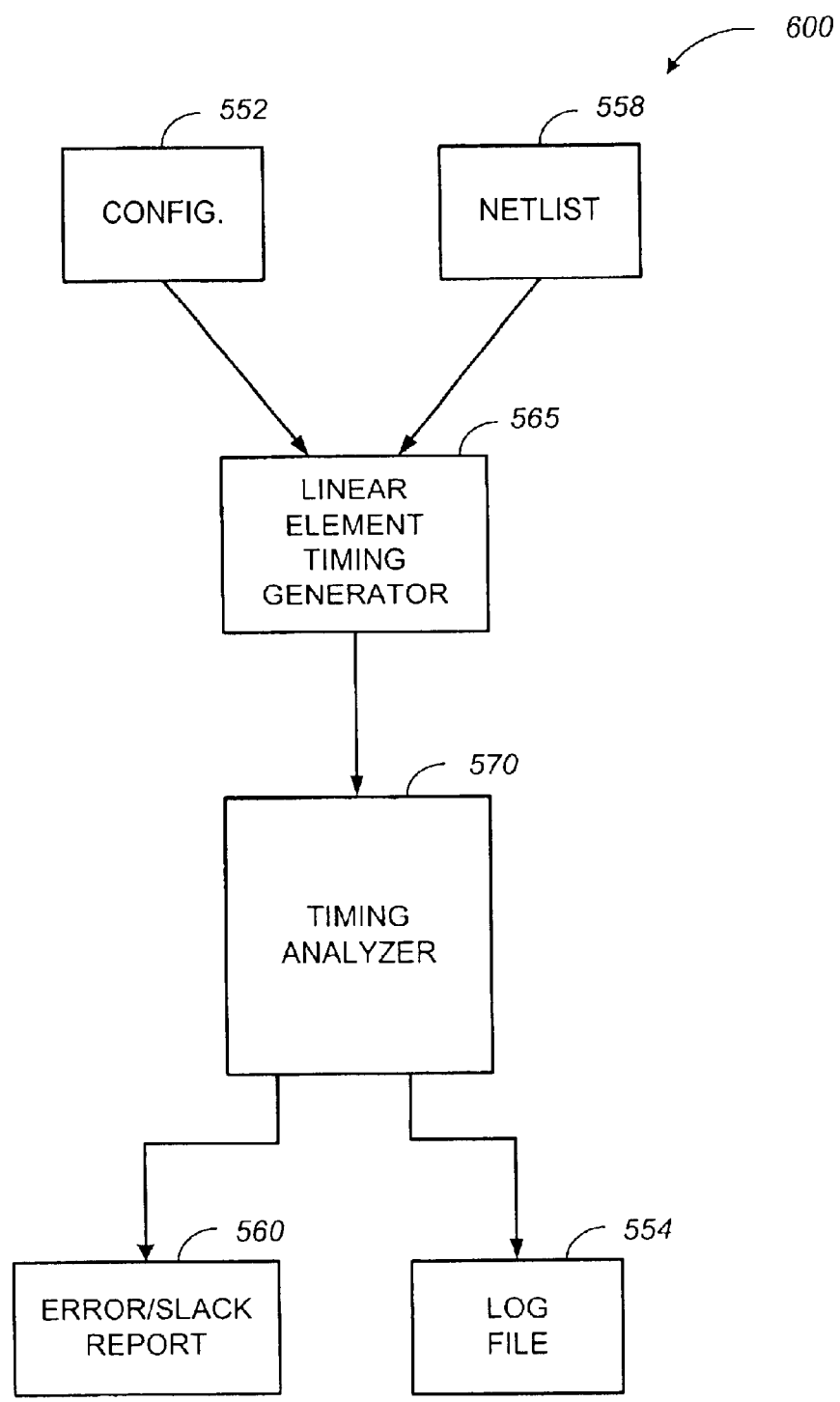
FIG. 6 is a functional block diagram illustrating a design process that can be implemented by the computing system of FIG. 5.

Reference is now directed to the functional block diagram of FIG. 6, which illustrates a representative design process 600 that can be implemented by the general-purpose computer 500 of FIG. 5. As illustrated in the design process 600, the linear element timing generator 565 operative within the general-purpose computer 500 may be programmed to receive information from configuration file 552 and one or more netlist files 558 describing a present model of the contemplated VLSI circuit. The netlist files 558 will describe the relative placement of circuit elements along the integrated circuit die including the clock signal distribution system. In addition, the netlist files 558 may describe the relative placement and coupling of functional blocks within the integrated circuit.

The linear element timing generator 565 may be programmed to apply relative timing information to identified interfaces conveyed in the configuration file 552 and the one or more netlists 558 to generate timing path delay values as described above with regard to FIGS. 4A–4C. It should be understood that timing path delay values may be generated and associated with each identified signal path within the integrated circuit representation under analysis. For signal-timing paths coupled to a linear element, the general-purpose computer 500 may be programmed to propagate the clock signal through each of the serially coupled storage elements that form the respective linear element.

Each functional block circuit designer or circuit design team may from time to time during the design process modify one or more elements within a particular clock distribution structure or signal path. As a result, a particular functional block design may receive an input signal substantially sooner than was previously indicated. As a result, one or more output signals forwarded from the functional block may reach the output ports of the functional block at an earlier point in the clock cycle, thus permitting more time for designers of subsequent blocks to complete their respective signal processing. Conversely, a designer of a particular functional block design may, for various reasons, be unable to complete the necessary logic processing within the allotted time. Stated another way, the integrated circuit design will exhibit a signal timing flaw because the desired signal will not reach its intended destination within the clock cycle. The timing analyzer 570 may include logic configured to prevent a circuit designer and/or a circuit design team from storing a proposed circuit design that fails to meet a host of design criteria including the signal timing relationships described above. The design criteria applied by the timing analyzer 570 may include information regarding actual clock buffer placement throughout the contemplated circuit (in lieu of designing the circuit under the assumption that the clock signal reaches each functional block across the circuit at the same time).

The timing analyzer 570 may be configured to check the various signal paths to identify paths where a potential timing flaw or overlap may occur. Signal overlaps may be identified where the slack or confidence interval 475 is negative. A negative slack or confidence interval 475 is indicative that the signal path will not transmit the desired output signal within the allotted time to the destination storage element. As illustrated in FIG. 6, the timing analyzer 570 may be programmed to highlight signal paths where potential timing flaws may occur in a runtime log file 554 and/or in a error/slack report 560.

Figure 7:
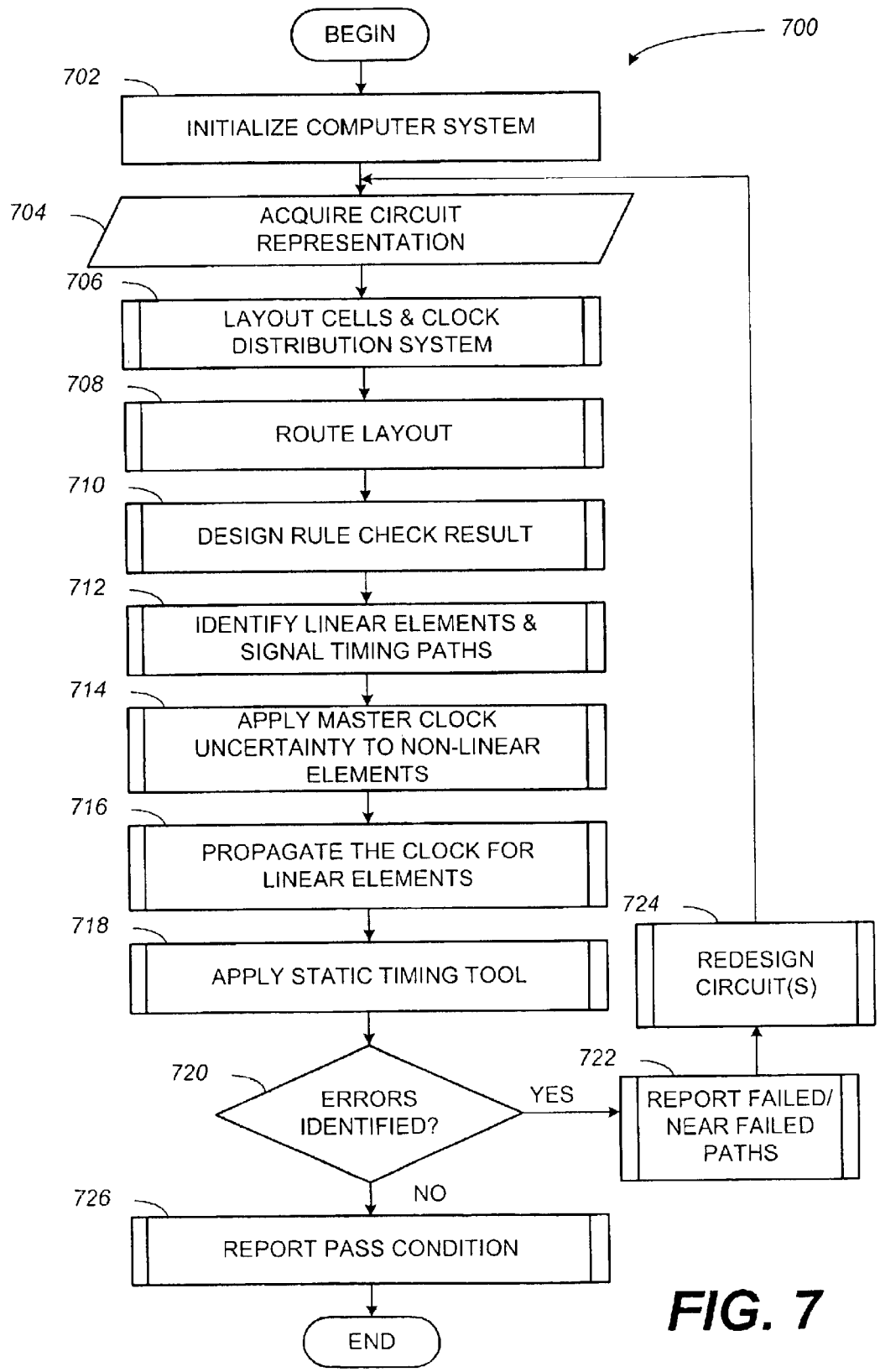
FIG. 7 is a flow diagram illustrating a method for verifying time-varying signal cooperation that can be implemented by the computing system of FIG. 5.

FIG. 7 is a flow diagram illustrating a representative method 700 for verifying time-varying signal cooperation that can be implemented by the general-purpose computer 500 of FIG. 5. As illustrated in the flow diagram, a general-purpose computer 500 configured to implement the method 700 may begin by initializing the system as shown in step 702. Step 702 may include loading a plurality of model (i.e., data) files. These files may include the configuration file 552, previously generated timing models 555, netlist files 558, technology file 553, and the parasitics file 556, among others. As described above, the plurality of data files are used to formulate a hierarchically arranged model of the various signal paths that associate the various functional blocks of the modeled circuit. Ultimately, the model can be used to verify signal timing between source and destination elements of a signal-timing path by modeling propagation of the clock signal along signal paths coupled to linear elements. The clock signal at each functional block may be modeled by information that includes the clock period and clock signal uncertainty.

Next, as shown in step 704, the general-purpose computer 500 may be programmed to acquire information representing cells, elements, or functional blocks that are to be integrated in the circuit. Thereafter, in steps 706, 708, and 710 the general-purpose computer 500 may be configured to layout the cells and the clock distribution system, route conductors to interconnect data and clock signal paths, and design rule check the resulting design.

As illustrated in step 712, the general-purpose computer 500 is configured to identify signal paths that are coupled to a linear element. In steps 714 and 716, the general-purpose computer 500 may be programmed to apply a master clock uncertainty value to clock signals coupled to non-linear elements and propagate the clock signal for signal paths that are coupled to linear elements, respectively. As described above, clock signal propagation can be performed by applying resistance and capacitance values to each leg of the linear elements that the signal path traverses. The resistance and capacitance values, commonly referred to as parasitics, may be defined in the parasitics file 556 for each linear element in the design. To simplify the model, parasitic information is not necessarily added to describe non-linear elements throughout the integrated circuit.

Once the clock signal has been propagated in step 716, the general-purpose computer 500 may be programmed to apply the calculated delay times in a static timing tool as indicated in step 718. As shown in the query of step 720, the general-purpose computer 500 can be programmed to determine if signal timing errors were identified by the static timing tool. When the response to the query of step 720 is affirmative as indicated by the flow-control arrow labeled "yes," the general-purpose computer 500 may be programmed to report the failed and/or near failed paths as shown in step 722. Thereafter, in step 724, the responsible individual may redesign the functional block or blocks and/or redistribute the clock signal as may be desired in an attempt to generate an integrated circuit design that will pass both the design rules and a static timing tool. As shown by the flow-control arrow exiting step 724, steps 704 through 724 may be repeated as necessary until an integrated circuit design is identified that is error free. Once the response to the query of step 720 is negative, meaning that no errors are identified, the general-purpose computer 500 may be programmed to report the pass condition to an operator of the computer or to one or more log or report files as shown in step 726.

Figure 8:
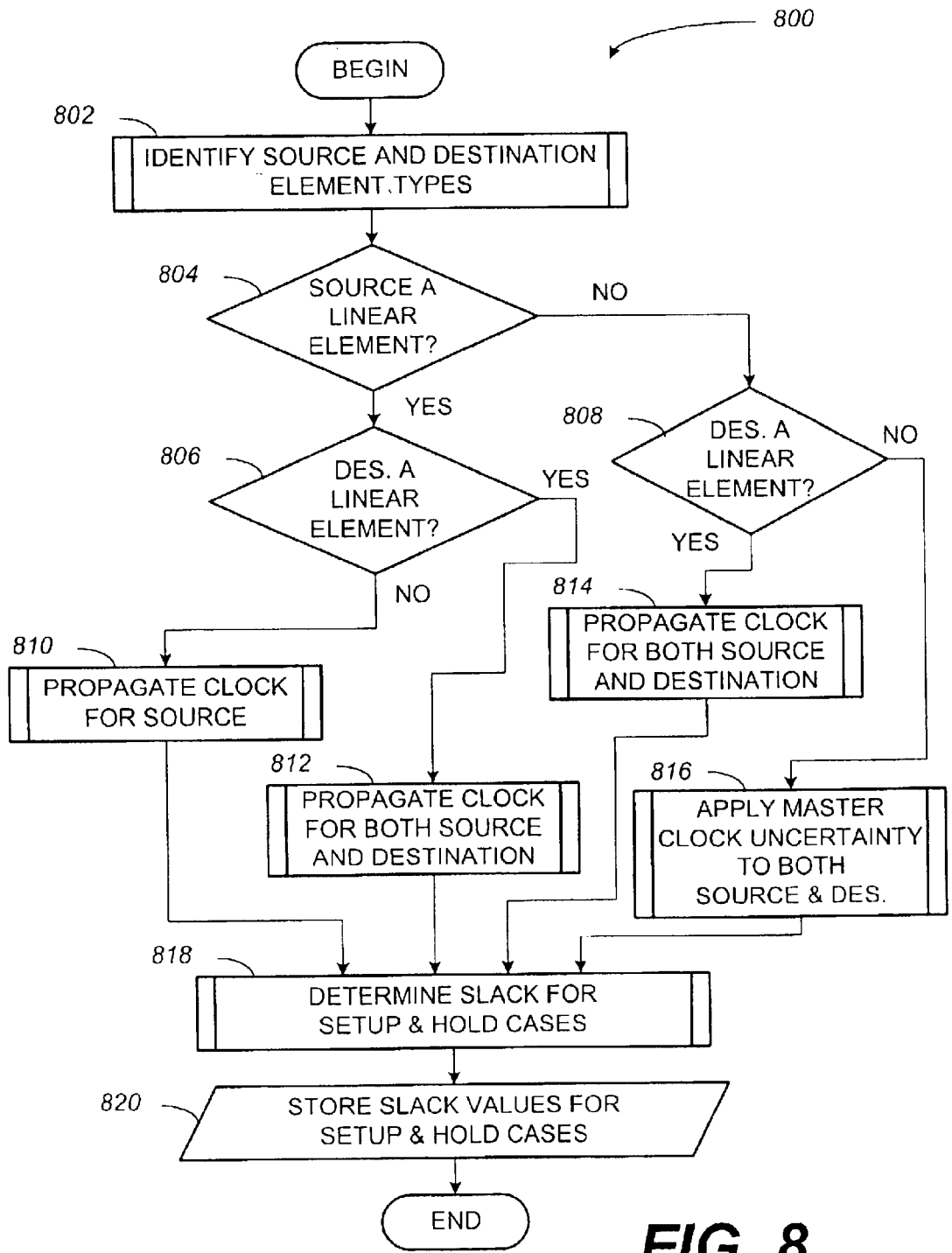
FIG. 8 is a flow diagram illustrating a representative process for determining a confidence interval for signal paths coupled to linear elements in an integrated circuit design that can be implemented by the computing system of FIG. 5.

Reference is now directed to FIG. 8, which presents a flow diagram illustrating a representative process for determining a confidence interval for signal paths coupled to linear elements in an integrated circuit design that can be implemented by the computing system of FIG. 5. As illustrated in FIG. 8, the method 800 may begin with step 802 where the general-purpose computer 500 is configured to identify the element type of both the source and destination elements defining the endpoints of each signal path in the integrated circuit design. Next, the general-purpose computer 500 may be configured to perform a series of queries in steps 804, 806, and 808 to determine which of the source and destination elements or both are coupled to linearly clocked elements. As illustrated in step 810, when it is the case that the source element in the signal path is associated with a linear element, the general-purpose computer 500 is programmed to propagate the clock to the source element as described above with regard to FIGS. 4A–4C. When it is the case that both the source and destination elements are coupled to linear elements, as shown in step 812, the general-purpose computer is programmed to propagate the clock to both the source and the destination elements. As shown in step 814, when it is the case that the destination element is coupled to a linear element, the clock signal is propagated to the destination element. Last, as shown in step 816, when neither the source nor the destination elements are coupled to linearly clocked elements, the general-purpose computer 500 may be programmed to model the clock signal using a master clock uncertainty value that may be applied throughout the integrated circuit design.

After either of steps 810 through 816 have been performed, processing may continue with step 818, where the general-purpose computer 500 is programmed to determine a confidence interval or slack value for setup and hold cases for a signal path of interest. Thereafter, the slack values may be stored in the memory 550 associated with the general-purpose computer 500 as illustrated in step 820.

Any process descriptions or blocks in the flow diagrams of FIG. 7 and FIG. 8 should be understood to represent modules, segments, or portions of code which include one or more executable instructions for implementing specific logical functions or steps in the method for verifying time-varying signal cooperation 700 and the method for determining a confidence interval 800. Alternate implementations are included within the scope of the preferred embodiment of the present invention in which functions may be executed out of order from that shown or discussed, including substantially concurrently or in reverse order, depending on the functionality involved, as would be understood by those skilled in the art of the present invention.

The detailed description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A circuit design system, comprising:
   a computer including logic for receiving information describing an integrated circuit design, the integrated circuit design including a description of a clock distribution system and a signal-timing path between a source element and a destination element in the circuit, the signal-timing path including a first linear element coupled to a clock distribution structure within a first clock distribution sub grid, the first linear element comprising the source element within a first set of serially-coupled storage elements and a second linear element within a second clock distribution sub grid, the second linear element comprising the destination element within a second set of serially-coupled storage elements; and
   a memory associated with the computer, the memory including executable logic configured to generate timing components responsive to specific model values for a signal that traverses the signal-timing path.

2. The system of claim 1, wherein the information comprises a netlist, the netlist describing the relative placement of the clock distribution system on the integrated circuit.

3. The system of claim 2, wherein the netlist describes the relative placement of a plurality of functional blocks.

4. The system of claim 2, wherein the netlist describes a clock driver coupled to the linear element.

5. The system of claim 1, wherein the clock distribution structure comprises a grid.

6. The system of claim 1, wherein the executable logic is responsive to a clock uncertainty value.

7. The system of claim 1, wherein clock distribution structure comprises a linear clock array.

8. The system of claim 1, wherein the model is used to propagate the clock.

9. A method for verifying time-varying signal cooperation across an integrated circuit, the method comprising the steps of:
   acquiring circuit information, the circuit information comprising a plurality of cells and a clock signal distribution system, the clock signal distribution system configured to provide a clock signal at the plurality of cells;
   identifying a signal-timing path;
   recognizing when the signal-timing path comprises first and second linear elements, the first linear element comprising serially-coupled storage elements within a first clock distribution sub grid, the first linear element comprising a source element coupled to a destination element within a second clock distribution sub grid;
   associating a clock uncertainty with the clock signal;
   determining a confidence interval for the signal-timing path responsive to the recognizing step, wherein the clock signal is propagated along the signal-timing path using timing components responsive to specific model values; and
   associating the confidence interval with the signal-timing path.

10. The method of claim 9, further comprising:
    applying the confidence interval in a static timing tool.

11. The method of claim 9, wherein the step of determining a confidence interval comprises calculating a setup value.

12. The method of claim 9, wherein the step of determining a confidence interval comprises calculating a hold value.

13. The method of claim 9, wherein the step of acquiring circuit information comprises a plurality of functional blocks.

14. The method of claim 13, wherein one of the plurality of functional blocks comprises a child block.

15. The method of claim 14, wherein the functional block defines a first hierarchical level and the child block defines a second hierarchical level.

16. A computer-readable medium having a program for verifying signal timing for an integrated circuit model, the program comprising:
    logic configured to identify a signal path within a representation of an integrated circuit, the signal path comprising a source element in a first linear element within a first clock distribution sub grid and a destination element in a second linear element within a second clock distribution sub grid;
    logic configured to propagate a clock signal over the signal path, wherein the clock signal is propagated via timing components responsive to specific model values; and
    logic configured to apply a clock signal uncertainty value to the first and second non-linear elements.

17. The computer-readable medium of claim 16, further comprising:
    logic configured to calculate a confidence interval.

18. The computer-readable medium of claim 17, further comprising:
    logic configured to apply the confidence interval in a static timing tool.

19. The computer-readable medium of claim 17, wherein the confidence interval comprises a setup case.

20. The computer-readable medium of claim 17, wherein the confidence interval comprises a hold case.

21. A computer aided circuit design tool, comprising:
    means for acquiring a representation of an integrated circuit, the integrated circuit comprising a plurality of cells and a clock signal distribution system, the clock signal distribution system comprising:
    a clock grid; and
    a linear clock driver coupled to the clock grid;
    means for identifying a signal path defined by a source element within a first linear element comprising serially-coupled storage elements within a first clock distribution sub grid and a destination element comprising serially-coupled storage elements within a second clock distribution sub grid; and means for determining timing components responsive to specific model values that account for a timing path delay for a signal that traverses the signal path.

22. The design tool of claim 21, wherein the means for determining timing components comprises calculating a setup case.

23. The design tool of claim 21, wherein the means for determining timing components comprises calculating a hold case.

24. The design tool of claim 21, further comprising:

means for applying the confidence interval in a static timing tool.

* * * * *